United States Patent
Mayer et al.

(10) Patent No.: US 9,568,259 B2
(45) Date of Patent: Feb. 14, 2017

(54) HEAT-CONDUCTIVE CONNECTION ARRANGEMENT

(71) Applicant: Robert Bosch GmbH, Stuttgart (DE)

(72) Inventors: Frank Mayer, Vaihingen/Enz (DE); Juergen Jerg, Ofterdingen (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 14/501,273

(22) Filed: Sep. 30, 2014

(65) Prior Publication Data

US 2015/0092350 A1 Apr. 2, 2015

(30) Foreign Application Priority Data

Sep. 30, 2013 (DE) .................... 10 2013 219 688

(51) Int. Cl.
*H05K 7/20* (2006.01)
*F28F 21/00* (2006.01)
*H05K 1/02* (2006.01)

(52) U.S. Cl.
CPC ........... *F28F 21/00* (2013.01); *H05K 7/20472* (2013.01); *H05K 1/0206* (2013.01)

(58) Field of Classification Search
None
See application file for complete search history.

(56) References Cited

U.S. PATENT DOCUMENTS

| | | | |
|---|---|---|---|
| 4,563,375 A | 1/1986 | Ulrich | |
| 5,120,665 A * | 6/1992 | Tsukagoshi | H01L 21/563 156/64 |
| 5,302,456 A * | 4/1994 | Matsui | H01B 1/22 257/E21.511 |
| 5,965,064 A * | 10/1999 | Yamada | C09J 9/02 174/259 |
| 6,403,166 B1 * | 6/2002 | Suzuki | B41J 2/315 427/212 |
| 6,545,351 B1 * | 4/2003 | Jamieson | H01L 23/3128 257/668 |
| 6,903,463 B1 * | 6/2005 | Takeichi | C09J 11/00 257/778 |
| 8,737,073 B2 * | 5/2014 | Yeh | H05K 1/0203 174/260 |
| 2004/0234763 A1* | 11/2004 | Saito | C08G 59/18 428/402.2 |
| 2010/0025089 A1* | 2/2010 | Taketatsu | H01R 4/04 174/257 |
| 2010/0330364 A1* | 12/2010 | Arifuku | C09J 4/06 428/349 |
| 2011/0114893 A1* | 5/2011 | Watanabe | C08G 18/0823 252/500 |

(Continued)

*Primary Examiner* — Courtney Smith
(74) *Attorney, Agent, or Firm* — Michael Best & Friedrich LLP

(57) ABSTRACT

A heat-conductive connection arrangement for connecting a printed circuit board to a cooling body. The connection arrangement has a carrier which is flat. At least part of the carrier includes at least one balloon body which faces away from the carrier and is connected to the carrier. The balloon body includes an envelope which encloses an interior, and the interior is at least in part filled with a preferably free-flowing, in particular viscous, heat-conducting substance. The envelope is configured so as to tear open under the influence of pressure and to thus release the heat-conducting substance.

8 Claims, 4 Drawing Sheets

(56) References Cited

U.S. PATENT DOCUMENTS

2012/0228559 A1\* 9/2012 Enomoto ................ H01B 1/02
   252/514
2014/0312501 A1\* 10/2014 Liang ..................... B32B 27/16
   257/773

\* cited by examiner

HEAT-CONDUCTIVE CONNECTION ARRANGEMENT

BACKGROUND OF THE INVENTION

The invention relates to a heat-conductive connection arrangement or means for connecting a printed circuit board to a cooling body. The connection means has a carrier which is configured so as to be flat.

In connection arrangements which are known from the prior art, comprising a power semiconductor and a cooling body, the power semiconductor is connected to the cooling body in a heat-conducting manner by means of a free-flowing heat-conducting means, for example a heat-conducting paste or a heat-conducting adhesive. To this end, the heat-conducting means is applied onto a surface of the semiconductor or the cooling body by means of a dispensing device. The power semiconductor, or a printed circuit board which is connected to the power semiconductor, is then brought together with the cooling body, wherein the viscous heat-conducting means forms a heat-conducting bridge between the power semiconductor, the printed circuit board, and the cooling body.

SUMMARY OF THE INVENTION

According to the invention, at least part of the carrier of the type mentioned at the outset displays at least one balloon body which faces away from the carrier and is connected to the carrier. The balloon body displays an envelope which encloses the interior, wherein the interior is at least in part or completely filled with a preferably free-flowing, in particular viscous, heat-conducting means. The envelope is configured so as to tear open under the influence of pressure and to thus release the heat-conducting means.

Using the thus configured connection means, a heat-conducting connection between two components to be connected to one another can advantageously be produced, wherein a dispensing device or a method stop of dispensing the heat-conducting means during production can advantageously be dispensed with. The thus configured heat-conducting connection means can furthermore advantageously be connected, for example adhesively connected, to a component to be connected, for example a cooling body, and thus be advantageously used as a pre-assembled component in a production process.

The free-flowing heat-conducting means is configured so as to flow or to be pressed into a gap to be bridged and to fill the gap. A viscosity of the heat-conducting means is preferably liquid at a processing temperature, that is to say self-flowing or pasty, and thus free-flowing under the influence of pressure from the printed circuit board.

In one preferred embodiment, the carrier displays a fabric. The fabric is a polyamide fabric or a polyimide fabric, for example.

In another embodiment, the carrier displays a carrier film. The carrier film preferably comprises a plastic film, in particular a polyimide film. In another embodiment, the carrier film is formed by a metal foil. The carrier is preferably configured so as to be flexible. The carrier may thus be advantageously provided, for example, as a roll product in the form of a roll tape.

In one preferred embodiment, the envelope is formed by a plastic envelope. The plastic envelope is formed, for example, by a polyimide envelope, a polyamide envelope, or formed by an elastomer, for example silicone rubber. The envelope preferably displays an envelope wall, wherein a wall thickness of the envelope is preferably between three and ten micrometers, furthermore preferably between three and five micrometers.

The heat-conducting means preferably displays a silicone-containing paste as a matrix.

In another embodiment, the heat-conducting means displays a heat-conductive adhesive as a matrix. For example, the heat-conducting adhesive is a cross-linking silicone adhesive, in particular configured as a self-cross-linking silicone adhesive. By way of the heat-conducting means, gaps between the semiconductor component or the printed circuit board and the cooling body may advantageously be bridged in a heat-conducting manner, while adapting to the respective surface structure, and heat-insulating air volumes in the gap can thus be filled.

The heat-conducting means preferably displays filler particles which are configured so as to be heat conductive, for example ceramic filler particles, such as aluminum oxide, or graphite particles. The filler particles thus advantageously cause good overall heat conductivity of the connection means comprising the filler particles and a viscous matrix.

In one preferred embodiment, the envelope is formed by a polyimide film. The polyimide film thus causes good heat conductivity of the connection means, in so far as the envelope is surrounded by the heat-conducting means after being torn open, and remains together with the heat-conducting means between the components to be connected after connecting the components, for example a power semiconductor to the cooling body. The envelope is preferably configured to be so thin that the envelope, as a proportion of the volume of the balloon body, cannot substantially frustrate heat conduction through the heat-conducting means.

In one preferred embodiment, the connection means displays at least one pin, wherein the pin is connected to the carrier and, under the influence of pressure on the carrier, is configured and disposed so as to penetrate the envelope of the balloon body and to thus release the heat-conducting means. By means of the pin, tearing-open or bursting-open of the balloon body under the influence of pressure can be advantageously facilitated. The connection means preferably displays at least one pin for each balloon body. The pin is preferably connected to the carrier. The pin is preferably a plastic pin, a metal pin or a pin configured from ceramic.

The pin is preferably configured so as to be flexible, such that the pin, after piercing the balloon envelope, in the event of potential contact with a surface of the components to be connected may lie flat against the surface.

In one preferred embodiment of the connection means, the balloon body is spherical. On account thereof, the balloon body can be applied onto the carrier in a low-cost manner, for example by pouring. In another embodiment, the balloon body is configured so as to be pillow-shaped. On account thereof, the balloon body can be advantageously mechanically applied onto the carrier.

The envelope of the balloon body may be assembled from at least two envelope halves, for example. To this end, a first envelope half may be filled with the heat-conducting means and subsequently the second envelope half may be connected to the first envelope half, such that the heat-conducting means is locked in the cavity thus enclosed by the two envelope halves.

The envelope halves may be plug-connected, adhesively connected or weld-connected to one another, for example.

The balloon body, in the case of the spherical shape, preferably has a diameter of between two millimeters and five millimeters. In the case of the pillow shape, the balloon body preferably has a thickness extent between two millimeters and five millimeters.

The abovementioned envelope preferably displays a default breaking point, for example in the form of a longitudinally extending notch, wherein the envelope, under the influence of pressure, is configured so as to tear at the default breaking point and to release the heat-conducting means.

The invention also relates to a connection arrangement, comprising a cooling body and at least one electronic component to be cooled, for example a power semiconductor. The power semiconductor is connected, in particular connected by soldering, to a printed circuit board, for example. The connection arrangement also displays at least one connection means according to the type described above. The cooling body preferably displays a recess in which the connection means is disposed. The electronic component or the printed circuit board is at least indirectly connected in a heat-conducting manner to the cooling body by means of the connection means, wherein the envelope of the at least one balloon body has released the heat-conducting means.

The invention also relates to a connection system for connecting a cooling body to an electronic component. The connection system comprises the cooling body, the aforementioned connection means, and a printed circuit board having an electronic component to be cooled, or only the electronic component without the printed circuit board.

The electronic component is a semiconductor component, for example, in particular a power semiconductor. The power semiconductor is an integrated semiconductor component, for example, a microprocessor, for example, a transistor, in particular a field-effect transistor, a MIS field-effect transistor or MOS field-effect transistor, for example.

The invention also relates to a method for connecting a printed circuit or a semiconductor component to a cooling body in a heat-conducting manner.

In the method, a connection means having at least one carrier and at least one balloon body filled with a viscous heat-conducting means is disposed between the cooling body and the printed circuit board or the semiconductor component, respectively, and the printed circuit board is pressed onto the cooling body in such a manner that an envelope of the balloon body tears and releases the heat-conducting means, and the heat-conducting means produces a heat-conducting connection between the cooling body and the printed circuit board.

In the method, when bringing together the cooling body and the printed circuit board, the envelope of the balloon body is preferably breached by means of at least one pin or at least one needle such that the viscous heat-conducting means emerges from the balloon body.

BRIEF DESCRIPTION OF THE DRAWINGS

The invention is now described in the following by means of figures and further exemplary embodiments. Further advantageous variants of embodiments are obtained from the features described in the figures and in the dependent claims.

DETAILED DESCRIPTION

Figure 1:
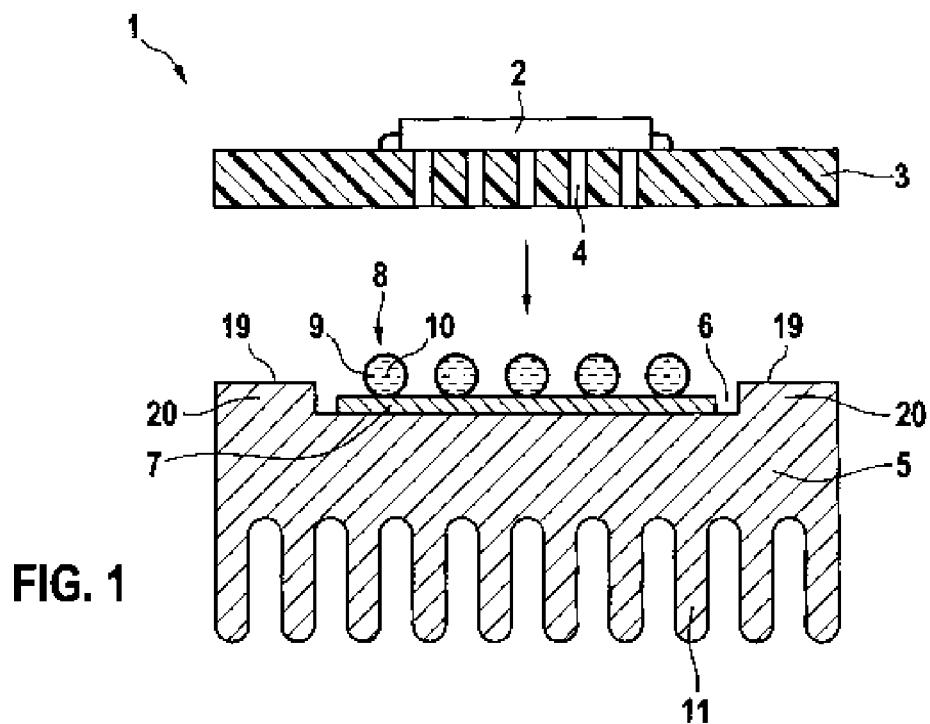
FIG. 1 shows an exemplary embodiment of a connection arrangement having a printed circuit board and a cooling body and a heat-conductive connection means.

FIG. 1, in a schematic manner, shows an exemplary embodiment of a connection arrangement 1 in a sectional illustration. The connection arrangement 1 comprises a semiconductor component 2 which is connected to a printed circuit board 3. The printed circuit board 3, in this exemplary embodiment, comprises a plurality of heat-conductive vias of which a via 4 is indicated in an exemplary manner. The vias are formed by copper cylinders, for example. The connection arrangement 1 also comprises a cooling body 5. The cooling body 5, in this exemplary embodiment, is formed by a metal block. The cooling body 5 has a recess 6, wherein a heat-conductive connection means is disposed in the recess 6. The connection means, in this exemplary embodiment, displays a carrier 7 and a balloon body connected to the carrier 7. One of the balloon bodies, balloon body 8, is indicated in an exemplary manner.

The balloon body 8 displays an envelope 9 which encloses a cavity. A heat-conducing means 10 which is configured so as to be viscous is received in the cavity.

The cooling body 5 also displays a web 20 which, in this exemplary embodiment, is configured in an encircling manner around the recess 6. The cooling body 5, in this example, also displays cooling fins of which one cooling fin 11 is indicated in an exemplary manner.

The recess 6, in this exemplary embodiment, configures an opening which is surrounded by the web 20 and wherein a surface region of the web 20 that faces toward the printed circuit board 3 forms an opening border 19 of the recess.

The balloon bodies, such as the balloon body 8, are in part received in the recess 6 and in a remaining further part protrude from the recess 6 and beyond the opening border 19.

When the printed circuit board 3, together with the semiconductor component 2, is placed onto the cooling body 5—as is illustrated by the arrow—the printed circuit board 3, by way of a side which is opposite to the semiconductor component 2, can crush the envelopes of the balloon bodies, such as the envelope 9 of the balloon body 8, and thus cause them to burst. The heat-conducting means 10 which is formed by a heat-conducting paste or a heat-conducting adhesive, for example, may flow into the recess 6 and fill the recess 6.

Figure 2:
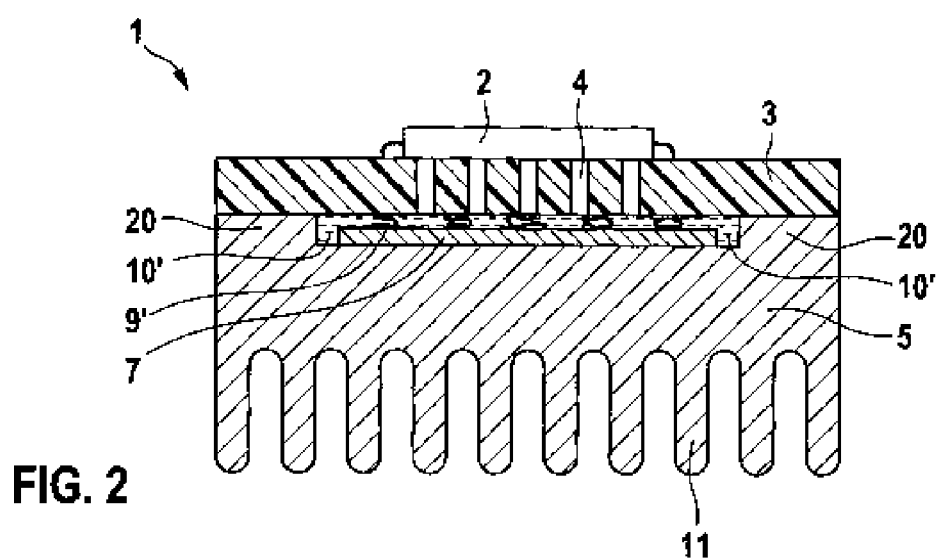
FIG. 2 shows the connection arrangement illustrated in FIG. 1, in which the cooling body is connected to the printed circuit board and the balloon bodies have released the heat-conducting means.

FIG. 2 shows the connection arrangement already illustrated in FIG. 1, in which the printed circuit board 3, together with the semiconductor component 2, is connected to the cooling body 5. The printed circuit board 3 here bears on the opening border 19 of the web 20, configured in an encircling manner, which thus forms a stop and a border which seals the printed circuit board 3 toward the cooling body 5.

FIG. 2 also shows the envelopes of the balloon body 8, which in FIG. 2 are illustrated as burst envelopes 9' and which have burst on account of the printed circuit board 3 being pressed against the cooling body 5. On account of the printed circuit board 3 being pressed against the cooling body 5, the heat-conducting paste has thus been able to fill the recess 6 illustrated in FIG. 1 and is illustrated as a heat-conducting means 10'. In case of the heat-conducting means 10' being a heat-conducting adhesive, the printed circuit board 3 may thus be adhesively connected in a heat-conducting manner to the cooling body 5.

Figure 3:
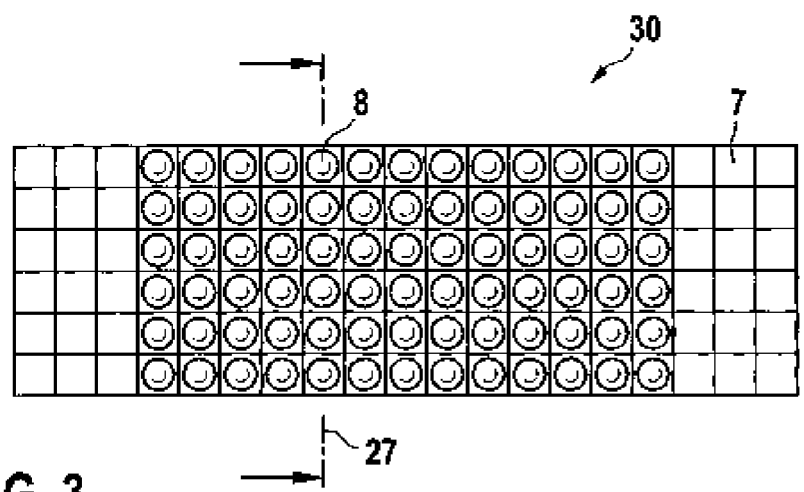
FIG. 3 shows the connection means illustrated in FIG. 1, in a plan view.

FIG. 3, in a plan view, shows the connection means 30 which has already been illustrated in a sectional illustration in FIG. 1, comprising the carrier 7 and the balloon bodies of which the balloon body 8 is indicated in an exemplary manner, In this exemplary embodiment, the connection means 30 displays 78 balloon bodies, such as the balloon body 8, which are disposed on the carrier 7—in this exemplary embodiment in a grid-shape—and are connected to the carrier 7.

Figure 5:
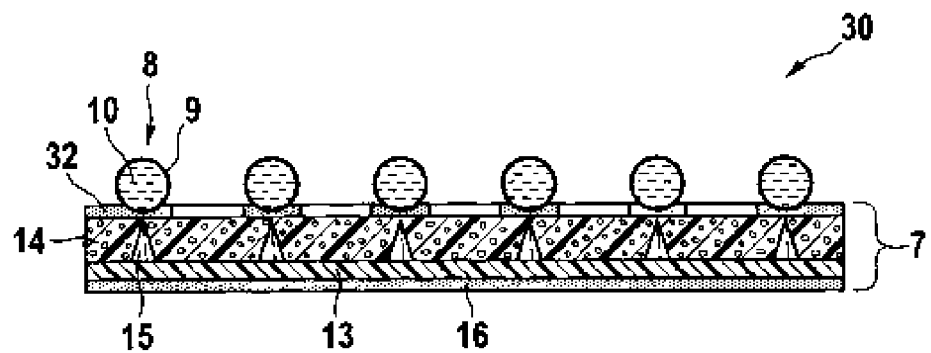
FIG. 5 shows an exemplary embodiment of the connection means illustrated in FIG. 3, in detail in a sectional illustration.

A section line 27 belonging to a sectional illustration, illustrated in FIG. 5, of the connection means 30 illustrated in FIG. 3 is also illustrated.

Figure 4:
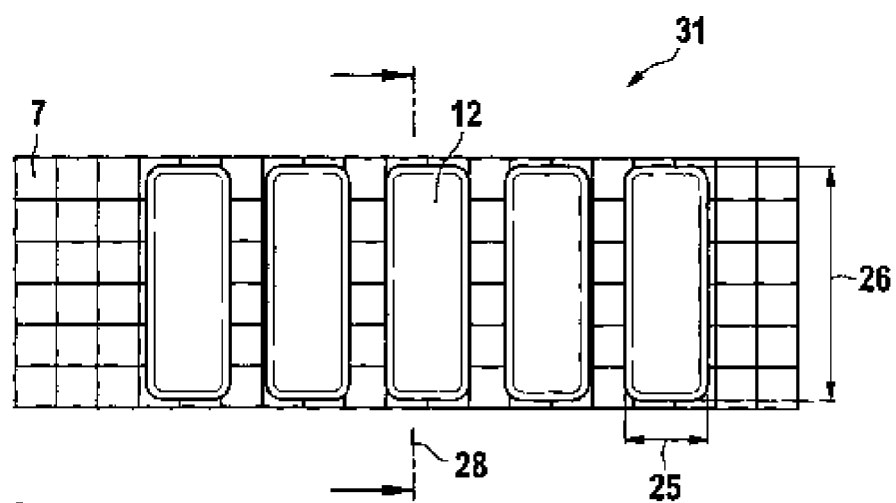
FIG. 4 shows a variant of the connection means illustrated in FIG. 3, in a plan view.

FIG. 4 shows a variant of the connection means 30 illustrated in FIG. 3, in which the carrier 7 is connected to pillow-shaped balloon bodies instead of spherical balloon bodies, such as the balloon body 8.

The connection means 31 according to FIG. 4, in the exemplary embodiment shown in FIG. 4, displays five balloon bodies of which the balloon body 12 is indicated in an exemplary manner. The balloon bodies display in each case a rectangular pillow-shape which extends in a flat manner. A width 25 of the balloon body 12 is between three and six millimeters, for example, a length 26 of the balloon body 12 is between ten and 25 millimeters, for example.

The balloon bodies, such as the balloon body 12, in their longitudinal extent, are transversely disposed to a longitudinal extent of the carrier 7. The carrier 7, in this exemplary embodiment, forms a longitudinal portion of a tape-shaped connection means which, for example, is wound onto a package and from which a longitudinal portion has been severed for producing the connection means 31.

Figure 6:
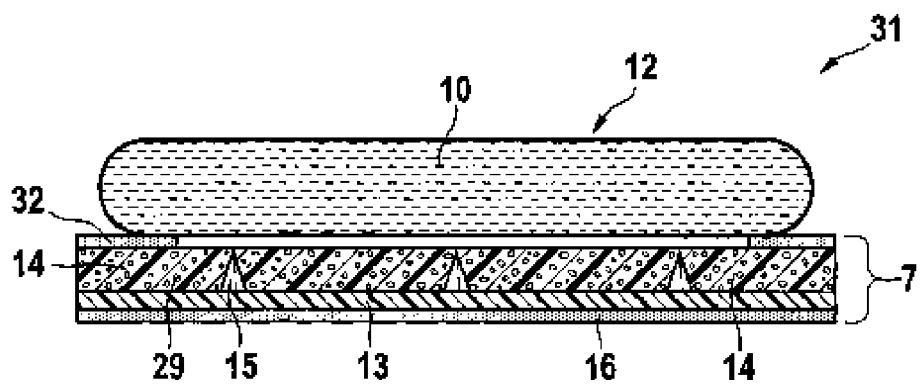
FIG. 6 shows an exemplary embodiment of the connection means illustrated in FIG. 4, in detail in a sectional illustration.

A section line 28 forms a sectional marking along which the connection means, shown in FIG. 4, is shown in FIG. 6 in a sectional illustration.

FIG. 5 shows a sectional illustration of the connection means illustrated in FIG. 3 along the section line 27. Illustrated are the balloon bodies 8 which are connected to the carrier 7. The carrier 7, in this exemplary embodiment, comprises a carrier film 13 which is formed by a polyimide film, for example. A foam-material layer 14, which is connected to the carrier film 13, is disposed between the balloon bodies, such as the balloon body 8. The carrier 7, for each balloon body such as the balloon body 8, also displays at least one pin, in this exemplary embodiment a pin 15, which is connected to the carrier film 13 and, with a tip of the pin, extends toward the balloon body 8.

The balloon bodies, such as the balloon body 8, are in each case connected by means of an adhesive 32 to the foam-material layer 14. The balloon body 8 may thus be connected by means of the adhesive 32 to the foam-material layer 14 and thus indirectly to the carrier layer 13. The foam-material layer 14 in this exemplary embodiment is formed by an open-pore foam, for example a polyurethane foam or a polyether foam. The foam of the foam-material layer 14 is configured so as to receive the viscously configured adhesive 10 and to thus form a heat-conductive bridge between the printed circuit board 3 illustrated in FIG. 2 and the carrier film 13. The carrier film 13, in this exemplary embodiment, on a side facing away from the foam-material layer 14, is connected to an adhesive layer 16. The connection means may thus be readily adhesively affixed on the cooling body 5 in the recess 6.

The pin 15 advantageously displays a longitudinal extent in such a manner that the pin 15 does not protrude from the recess 6 in FIG. 1. The pins illustrated in FIG. 5, such as the pin 15, for example display in each case a longitudinal extent up to a plane which corresponds to the opening border and may thus advantageously form a stop or a support for the printed circuit board 3.

FIG. 6 shows the connection means 31 already illustrated in FIG. 4, which is illustrated in a sectional illustration along the section line 28.

The carrier 7 of the connection means 31 displays the carrier film 13 which has already been illustrated in FIG. 5 and which, on one side, is connected to an adhesive layer 16 and, on a side lying opposite to the adhesive layer 16, is connected to a foam-material layer 14.

At least one pin, in this exemplary embodiment a plurality of pins of which the pin 15 is indicated in an exemplary manner, is disposed in the foam-material layer 14. The pin 15, with a tip, points toward the balloon body 12. The balloon body 12 is connected to the foam-material layer 14 by means of an adhesive 32. If pressure is exerted on the balloon body 12—for example by the printed circuit board 3 illustrated in FIG. 1—the balloon body 12 may be pressed into the foam-material layer 14 which, in this exemplary body, is configured so as to be flexible, on account of which the envelope of the balloon body 12 is pierced by the at least one pin 15. The heat-conducting means 10 may then flow out and be received by cavities of the foam material of the foam-material layer 14 which are disposed in the foam-material layer 14. The cavity 29 is indicated in an exemplary manner. The foam material of the foam-material layer 14, in this exemplary embodiment, is configured as an open-pore foam material and can soak up the heat-conducting material 10. In another embodiment, the balloon body 12 may be connected to the carrier film 13 by means of a web which is configured so as to be flexible instead of the foam-material layer 14, wherein the web is configured to hold the balloon body in a manner spaced apart from pin 15 and to protect the latter against inadvertently plunging and to yield in the case of pressure on the balloon body 12, for example by the printed circuit board 3 in FIG. 1, such that the pin 15 can plunge into the balloon body.

In a different manner from that illustrated in FIGS. 5 and 6, the at least one pin 15 may be connected to the printed circuit board 3 in FIG. 1 and face away from a printed circuit board surface of the printed circuit board 3. The foam-material layer 14 illustrated in FIGS. 5 and 6 may then be dispensed with. The balloon bodies, such as the balloon body 8 or the balloon body 12, are then connected, in particular adhesively connected, to the carrier film 13.

Figure 7:
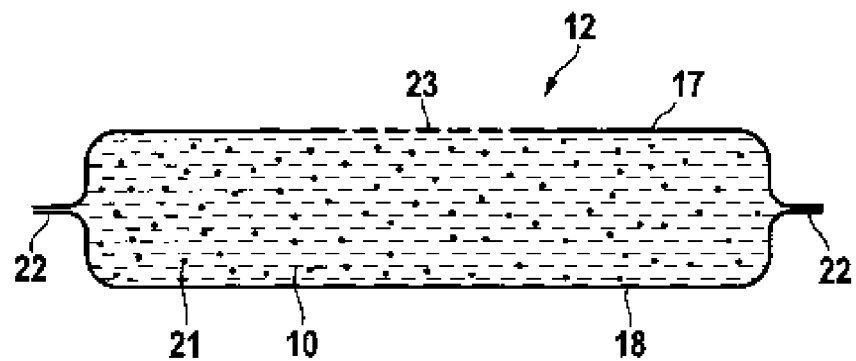
FIG. 7 shows an exemplary embodiment of a spherical balloon body in detail, and an exemplary method for producing the same.

FIG. 7 shows an exemplary embodiment of a pillow-shaped balloon body, such as the balloon body 12 illustrated in FIG. 4, in a sectional illustration. The balloon body 12 displays an envelope which comprises two envelope halves 17 and 18. The envelope halves 17 and 18 may be adhesively bonded or welded to one another in a first step. To this end, while forming a connection border 22, the envelope half 17 may be connected to the envelope half 18, for example by means of the influence of heat and compression. In a further step, the thus formed hollow balloon body 12 may be filled with the viscously configured heat-conducting means 10. A default breaking point 23 in the envelope half 17 is also illustrated with dashed lines and is formed, for example, by way of a line-shaped depression in the envelope half 17. The envelope half 17, under the influence of pressure on the envelope half 17, may tear open along the default breaking point 23 and thus release the heat-conducting means 10.

The heat-conducting means 10 displays filler particles 21, for example. The filler particles are ceramic particles, for example.

Figure 8:
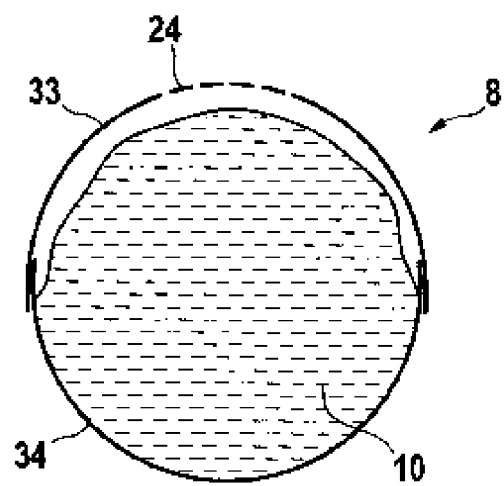
FIG. 8 shows an exemplary embodiment of a pillow-shaped balloon body in detail, and an exemplary method for producing the same.

FIG. 8 show an exemplary embodiment of a spherical balloon body, such as the balloon body 8 illustrated in FIG. 1. The balloon body 8 displays two envelope parts 33 and 34 which are in each case configured so as to be dome-shaped and which are configured so as to be plug-connected to one another and thereby configure a hollow-sphere shape.

The envelope part 34, for producing the balloon body 8, may be held in a hollow mold which is configured in a corresponding manner to the envelope part 34 and subsequently be filled with a viscously configured heat-conducting means 10. The envelope part 33 may subsequently, in a further step, be placed onto the envelope part 34 and thus, together with the envelope part 34, configure a spherical envelope, i.e. the envelope 9 illustrated in FIG. 1. The heat-conducting means 10, in another embodiment, may be injected through an opening in one of the envelope parts into the joined-together envelope parts, such that the balloon body 8 is completely filled with the heat-conducting means.

The envelope part 33, in the exemplary embodiment shown in FIG. 8, also displays a default breaking point 24 which is formed by at least one depression which is, for example, line-shaped, in the envelope part 33. The depression may be produced by stamping, for example.

In the case of the default breaking points 23 and 24 illustrated by dashed lines in FIGS. 7 and 8, respectively, the pin 15 illustrated in FIGS. 5 and 6 for piercing open the envelope of the balloon body may be dispensed with.

What is claimed is:

1. A connection arrangement, comprising:
   at least one electronic component to be cooled;
   at least one cooling body; and
   at least one connection means for connecting a printed circuit board to the at least one cooling body, having a carrier that is substantially flat, wherein at least part of the carrier includes at least one balloon body which faces away from the carrier and is connected directly to the carrier, wherein the balloon body includes an envelope which encloses an interior, wherein the interior is at least in part filled with a viscous heat-conducting means and the envelope having a structure that tears open under the influence of pressure and thus release the heat-conducting means, and
   wherein the at least one cooling body includes a recess in which the connection means is disposed, and the at least one electronic component is at least indirectly connected in a heat-conducting manner to the cooling body by means of the at least one connection means.

2. The connection means according to claim 1, wherein the carrier further comprises a fabric.

3. The connection means according to claim 1, wherein the carrier further comprises a carrier film.

4. The connection means according to claim 1, wherein the envelope is formed by a plastic envelope.

5. The connection means according to claim 1, wherein the connection means further includes at least one pin which, under the influence of pressure on the carrier, is configured and disposed so as to penetrate the envelope and to thus release the heat-conducting means.

6. The connection means according to claim 1, wherein the envelope is formed by a polyimide film.

7. The connection means according to claim 1, wherein the balloon body is configured so as to be spherically shaped or pillow-shaped.

8. The connection arrangement according to claim 1, wherein the carrier further comprises a plastic film.

* * * * *